United States Patent
Chang et al.

(10) Patent No.: US 7,531,296 B2
(45) Date of Patent: May 12, 2009

(54) METHOD OF FORMING HIGH ETCH RESISTANT RESIST PATTERNS

(75) Inventors: Ching-Yu Chang, Ilan Hsien (TW); Chin-Hsiang Lin, Hsinchu (TW)

(73) Assignee: Taiwan Semiconductor Manufacturing, Co., Ltd., Hsin-Chu (TW)

( * ) Notice: Subject to any disclaimer, the term of this patent is extended or adjusted under 35 U.S.C. 154(b) by 425 days.

(21) Appl. No.: 11/209,684

(22) Filed: Aug. 24, 2005

(65) Prior Publication Data

US 2007/0048675 A1    Mar. 1, 2007

(51) Int. Cl.
*G03F 7/26* (2006.01)
(52) U.S. Cl. ...................................... 430/313; 430/330
(58) Field of Classification Search ................ 430/311, 430/313, 314, 330
See application file for complete search history.

(56) References Cited

U.S. PATENT DOCUMENTS

| 2003/0088995 A1* | 5/2003 | Bergman et al. | ............... 34/415 |
| 2004/0033445 A1* | 2/2004 | Lee et al. | ................... 430/313 |
| 2005/0233259 A1* | 10/2005 | Endo et al. | ................. 430/313 |

* cited by examiner

*Primary Examiner*—Kathleen Duda
(74) *Attorney, Agent, or Firm*—Birch, Stewart, Kolasch & Birch, LLP

(57) ABSTRACT

A method for forming an etch-resistant photoresist pattern on a semiconductor substrate is provided. In one embodiment, a photoresist layer is formed on the substrate. The photoresist layer is exposed and developed to form a photoresist pattern. A polymer-containing layer is formed over the photoresist pattern. The photoresist pattern and the polymer-containing layer are thermally treated so that polymer is substantially diffused into the photoresist pattern thereby enhancing the etch resistance of the photoresist pattern. The polymer-containing layer is thereafter removed.

6 Claims, 2 Drawing Sheets

METHOD OF FORMING HIGH ETCH RESISTANT RESIST PATTERNS

BACKGROUND

The present invention relates generally to the manufacture of semiconductor devices, and more particularly, to the formation of high etch resistant photoresist patterns.

As semiconductor devices develop into the sub-micron region and are more highly integrated, interconnections and isolation widths required in the manufacturing processes have become very fine. In general, a fine pattern is formed through a process including forming a resist pattern by a photolithographic technique, and etching various underlying thin films through the resist pattern. The photolithographic technique includes resist coating, mask alignment, exposure to light, and development. This technique has a limit due to the natural limitation of the wavelength of the exposing light. In other words, when using the conventional photolithographic technique, it is difficult to form a critical dimension of a fine resist pattern that exceeds the limit of the wavelength of the exposing light.

Furthermore, the conventional lithographic technique has difficulty in controlling the etching resistance of a resist pattern, making it impossible to fully control a surface profile. As such, the etched pattern on a substrate is relatively rough, especially on the surfaces of the side walls of the etched patterns. As semiconductor fabrication processes delve into the sub-micron level, it is increasingly difficult to obtain fine granularity dimensions with the photolithography technique. In addition, the resist pattern formed by conventional methods is further affected by the use of SEM E beam testing. The SEM E beam test is used for verification of the semiconductor dimensions, but causes shrinkage of the critical dimensions.

Accordingly, what is needed in the art are new fabrication methods that effectively create fine granularity semiconductor dimensions and provide control of etch resistance to the resist pattern layer.

SUMMARY

The present invention is directed to a method for forming an etch-resistant photoresist pattern on a semiconductor substrate. In one embodiment, a photoresist layer is formed on the substrate. The photoresist layer is exposed and developed to form a photoresist pattern. A polymer-containing layer is formed over the photoresist pattern. The photoresist pattern and the polymer-containing layer are thermally treated so that polymer is substantially diffused into the photoresist pattern thereby enhancing the etch resistance of the photoresist pattern. The polymer-containing layer is thereafter removed.

In another embodiment, a photoresist layer is formed on the substrate. The photoresist layer is exposed and developed to form a photoresist pattern. A metal compound-containing layer is formed over the photoresist pattern. The photoresist pattern and the metal compound-containing layer are thermally treated so that metal compound is substantially diffused into the photoresist pattern thereby enhancing the etch resistance of the photoresist pattern. The metal compound-containing layer is thereafter removed.

In another embodiment, a photoresist layer is formed on the substrate. The photoresist layer is exposed and developed to form a photoresist pattern. An inorganic compound-containing layer is formed over the photoresist pattern. The photoresist pattern and the inorganic compound-containing layer are thermally treated so that inorganic compound is substantially diffused into the photoresist pattern thereby enhancing the etch resistance of the photoresist pattern. The inorganic compound-containing layer is thereafter removed.

BRIEF DESCRIPTION OF THE DRAWINGS

The features, aspects, and advantages of the present invention will become more fully apparent from the following detailed description, appended claims, and accompanying drawings in which:

DETAILED DESCRIPTION

In the following description, numerous specific details are set forth to provide a thorough understanding of the present invention. However, one having an ordinary skill in the art will recognize that the invention can be practiced without these specific details. In some instances, well-known structures and processes have not been described in detail to avoid unnecessarily obscuring the present invention.

In a conventional photolithographic technique, a typical resist layer used under a sub-193 nm radiation has poor etch resistance. One conventional method to increase the etch resistance of the resist pattern is to increase the thickness. However, this results in a decrease of effective depth of focus (DOF), a decrease in the process windows, a decrease in the critical dimension (CD) or CD uniformity, a decrease in resist pattern adhesion and a decrease in the yield stability. For example, the 0.3 um DOF window is hard to achieve for 65 nm products with a photoresist thickness of 2,000 Angstroms. For a 193 nm resist layer, the line end shortening after etch inspection (AEI) is worse than that of the 248 nm resist layer. Furthermore, the end to end, line end, or line to end dimension variation is difficult to correct by optical proximity correction (OPC) methods since the space between these patterns is not adequate for OPC correction. A strong optical proximity correction is required for the pattern correction; however, this may increase the complexity of the process. But the small fence pattern between two adjacent contact holes or trenches is hard to achieve by the conventional methods. After an etch inspection, the fence would peel, collapse, or be consumed during the etch process. Since a small hole or trench can only be achieved by smaller wavelength equipment, if the desired fine resolution cannot be achieved by the existing equipment, a new smaller wavelength machine is required, which adds to process equipment cost.

Reference will now be made in detail to the present preferred embodiments of the present invention, examples of which are illustrated in the accompanying drawings.

Figure 1A:
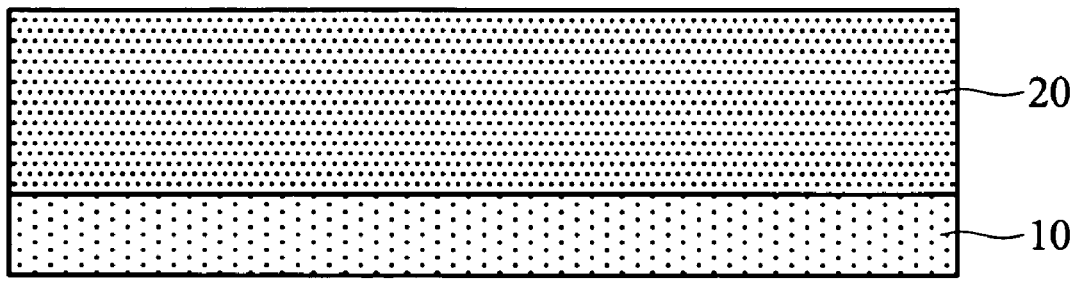
FIGS. 1A-1F are cross-sectional views of a semiconductor device depicting a method of forming etch resistant resist patterns according to one embodiment of the present invention.

FIGS. 1A-1F are cross-sectional views of a semiconductor device depicting a method of forming etch resistant resist patterns according to one embodiment of the present invention. In FIG. 1A, a view of a formation of a semiconductor device showing a photoresist layer 20 formed on a substrate 10 is depicted according to one embodiment of the present invention. The substrate 10 may include a substrate as employed within the microelectronic fabrication, wherein the substrate has formed thereupon and/or thereover any of several additional microelectronic layers as are conventionally employed within the microelectronic fabrication. These layers may include, for example, conductor materials, semiconductor materials and dielectric materials. It is understood that the type of the substrate is a design choice dependent on the fabrication process being employed. Photoresist layer 20 is deposited by conventional methods such as, for example, spin coating and may be deposited to a thickness of from about 500 Angstroms to about 5000 Angstroms. Photoresist layer 20 may be formed of photoresist materials as are conventional in the art of semiconductor fabrication, such as photoresist materials being selected from the general groups of photoresist materials including but not limited to positive photoresist materials and negative photoresist materials.

Figure 1B:
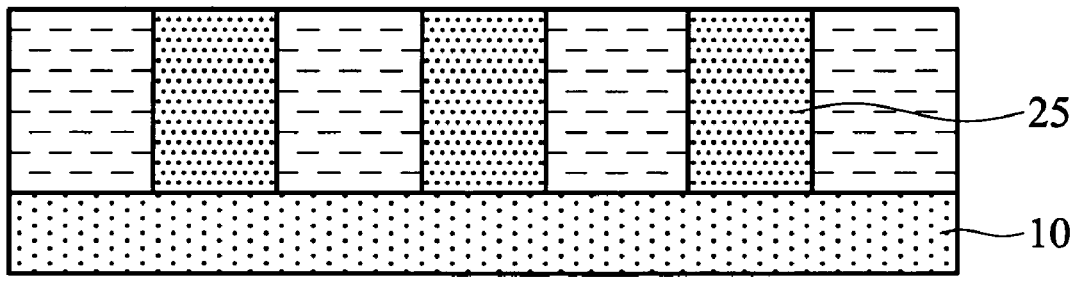

FIG. 1B is a view of the structure of FIG. 1A showing a further step of exposing the photoresist layer 20 according to one embodiment of the present invention. A photoresist pattern 25 is created on substrate 10 by exposing photoresist layer 20 to a radiation such as a particular light through a predefined mask. The exposing light may be for example a gray, deep UV light, KrF excimer laser beam, ArF excimer laser beam, electron beam, X-ray, and any of which has a wavelength corresponding to a sensitizing wavelength of the photoresist layer 20. In one embodiment of the present invention, photoresist layer 20 is exposed to define photoresist patterns 25 using well-known photolithographic processes, preferable high resolution (less than 0.25) deep UV (DUV) photolithography for optimum pattern resolution. The remaining photoresist patter 25 is depicted in FIG. 1C after subjecting the semiconductor device to a conventional development process.

Figure 1C:
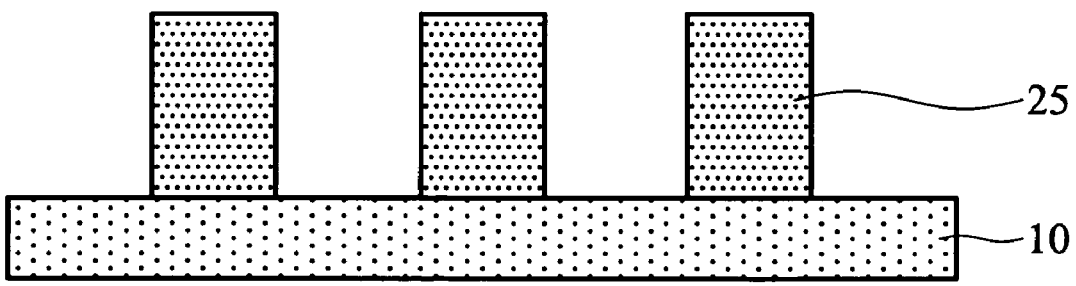
Figure 1D:
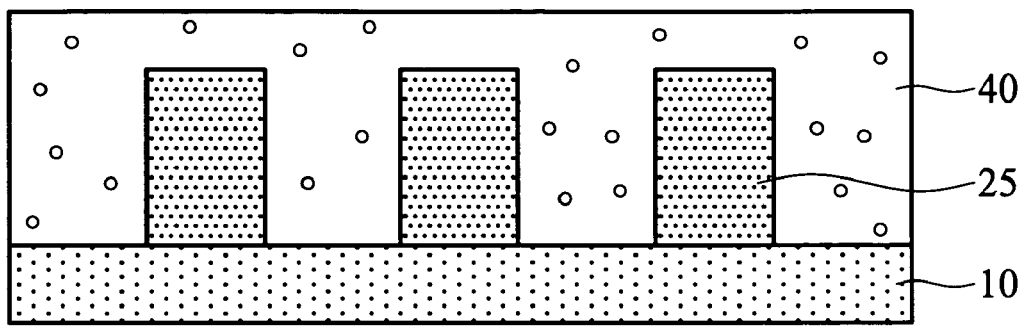

FIG. 1D is a view of the structure of FIG. 1C showing a further step of forming a polymer-containing layer 40 over the photoresist pattern 25 and substrate 10 according to one embodiment of the present invention. The polymer-containing layer 40 may contain materials such as Ti, Ta, Si, and single-bond, double-bond, or triple-bond materials including benzyl or phenyl group polymers. It is understood that double-bond polymers contain the double-bond between two carbon atoms or a carbon and an oxygen atom, and these bonds increase the etch resistance. Some of these elements may also be introduced to the photoresist layer 20 prior to the deposition of polymer-containing layer 40 over photoresist pattern 25 and substrate 10. For example, Ti, Ta, or Si molecules may be doped into photoresist layer 20 by conventional implant methods. In one embodiment of the present invention, supercritical solvents such as $CO_2$ may be used to introduce the molecules into photoresist layer 20.

Figure 1E:
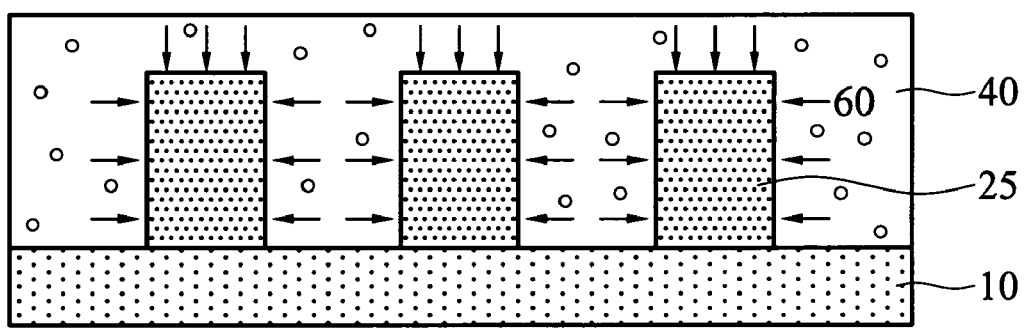

FIG. 1E is a view of the structure of FIG. 1D showing a further step of thermally treating the photoresist pattern 25 and the polymer-containing layer 40 so that polymer 60 is substantially diffused into the photoresist pattern 25 thereby enhancing the etch resistance of the photoresist pattern 25 according to one embodiment of the present invention. Photoresist pattern 25 and polymer-containing layer 40 may be treated thermally by conventional methods including ultraviolet, infrared, heat, hot plate, mega sonic, microwave, and heating coil. The thermal treatment causes polymer atoms to substantially diffuse from the polymer-containing layer 40 into the photoresist pattern 25 which gives photoresist pattern 25 with an overall enhanced etch resistance that can be used to create fine granularity features needed for sub-micron semiconductor devices. In one embodiment of the present invention, photoresist pattern 25 and polymer-containing layer 40 are thermally treated at a temperature ranging from about 50 to about 200 degrees Celsius for about ten seconds to about five minutes. In another embodiment, photoresist pattern 25 and polymer-containing layer 40 are thermally treated by conventional mega sonic power of from about 10 to 1000 Kw/Hz and for about five seconds to about five minutes.

Figure 1F:
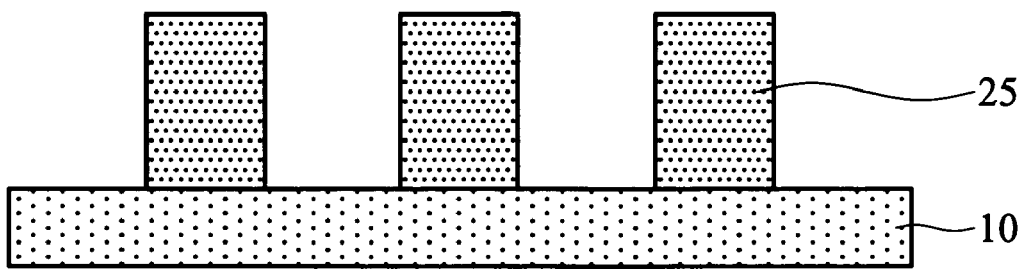

FIG. 1F is a view of the structure of FIG. 1E showing a further step of removing the polymer-containing layer 40 according to one embodiment of the present invention. Polymer-containing layer 40 may be removed by conventional methods and materials; such methods and materials may typically, but not exclusively, include wet chemical fluid stripping methods and materials and dry oxygen plasma stripping methods and materials.

The steps of the method for forming an etch-resistant photoresist pattern using a polymer-containing layer 40 generates a resist pattern with an overall enhanced etch resistance that can be used to create fine granularity features needed for sub-micron semiconductor devices. Furthermore, aspects of the present invention allow the critical dimension (CD) of the photoresist pattern depicted in FIG. 1F to remain relatively unchanged to the CD of the photoresist pattern depicted in FIG. 1C.

FIGS. 1A-1F depicted views of a semiconductor device showing a method of forming etch resistant resist patterns using a polymer-containing layer to enhance the etch-resistance of the photoresist pattern according to one embodiment of the present invention. However, in another embodiment of the present invention, a metal compound-containing layer may be used to enhance the etch-resistance of the photoresist pattern. In one embodiment, the metal compound-containing layer may contain Ti, Ta, TiN, W, Fe, Cu, C, Si and combinations thereof. The steps of the method for forming an etch-resistant photoresist pattern using a metal compound-containing layer are generally the same as those for using a polymer-containing layer, as depicted in FIGS. 1A-1F, and therefore will not be further repeated.

In another embodiment of the present invention, an inorganic compound-containing layer may be used to enhance the etch-resistance of the photoresist pattern. In one embodiment, the inorganic compound-containing layer may contain Si, $SiO_2$, N, SiN, oxide, and low-k material and combinations thereof. The steps of the method for forming an etch-resistant photoresist pattern using an inorganic compound-containing layer are generally the same as those for using a polymer-containing layer, as depicted in FIGS. 1A-1F, and therefore will not be further repeated.

In the preceding detailed description, the present invention is described with reference to specifically exemplary embodiments thereof. It will, however, be evident that various modifications, structures, processes, and changes may be made thereto without departing from the broader spirit and scope of the present invention, as set forth in the claims. The specification and drawings are, accordingly, to be regarded as illustrative and not restrictive. It is understood that the present invention is capable of using various other combinations and environments and is capable of changes or modifications within the scope of the inventive concept as expressed herein.

What is claimed is:

1. A method for forming an etch-resistant photoresist pattern on a semiconductor substrate, comprising:
   forming a photoresist layer on the substrate;
   exposing the photoresist layer;
   developing the photoresist layer to form a photoresist pattern;
   depositing a polymer-containing layer over exposed surfaces of the photoresist pattern and the substrate, wherein the polymer-containing layer comprises titanium-containing polymer or tantalum-containing polymer; and
   thermally treating the photoresist pattern and the polymer-containing layer so that polymer is substantially diffused into the photoresist pattern thereby enhancing the etch resistance of the photoresist pattern.

2. The method of claim 1, further comprising removing the polymer-containing layer.

3. The method of claim 1, wherein the polymer-containing layer comprises silicon-containing polymer.

4. The method of claim 1, wherein the thermally treating the photoresist pattern and the polymer-containing layer comprises heat, ultra-violet, infrared, hot plate, mega sonic, microwave, or heating coil.

5. The method of claim 1, wherein the thermally treating the photoresist pattern and the polymer-containing layer is performed at a temperature ranging from about 50 to about 200 degrees Celsius.

6. The method of claim 1, wherein the thermally treating the photoresist pattern and the polymer-containing layer comprises subjecting the photoresist pattern and the polymer-containing layer to a mega sonic power of from about 10 to 1000 Kw/Hz for about five seconds to about five minutes.

* * * * *